Jan. 8, 1952

D. H. MITCHELL 2,581,966

TUNER

Filed Feb. 14, 1947

2 SHEETS—SHEET 1

INVENTOR.
Donald H. Mitchell
BY Foorman L. Mueller
Atty.

TUNER

Filed Feb. 14, 1947

2 SHEETS—SHEET 2

INVENTOR.
Donald H. Mitchell
BY Foorman L. Mueller
Atty.

Patented Jan. 8, 1952 2,581,966

UNITED STATES PATENT OFFICE 2,581,966

TUNER

Donald H. Mitchell, Chicago, Ill., assignor to Motorola, Inc., a corporation of Illinois Application February 14, 1947, Serial No. 728,695

9 Claims. (Cl. 250—20)

This invention relates generally to tuners and in particular to a tuner for a superheterodyne receiver in which all the elements required for tuning the antenna and oscillator circuits are combined in a single unit.

In prior art radio receivers, tuning of the various circuits over a band of frequencies is accomplished either by providing variable condensers in the circuits which are ganged together, or by providing ganged variable inductances. These two arrangements although generally analogous each have certain advantages and disadvantages. More specifically, condenser tuning, while requiring a relatively large unit and a unit which is subject to being thrown out of adjustment by vibration, is more suitable for tuning a loop antenna due to the relatively large inductance. On the other hand, inductance tuners such as movable iron core units have the advantage that they may be constructed as very small and compact units which are sturdy as required for vehicular and portable radio sets. Inductance tuning is also particularly adaptable for tuning oscillator circuits as a constant oscillator current may be had through a range of frequencies. However, when used with an antenna which is inherently inductive, such as a loop antenna, inductance tuning is not advantageous.

The use of combined capacity and inductance tuning has not been found to be satisfactory principally because of mechanical difficulties in providing a unit in which the variable condensers and inductances involved are ganged for operation by a single control. This is due to the fact that a rotary movement is generally used for operation of variable condensers and a reciprocal movement is required for operation of variable inductances and in order to provide operation of the two in complete unison, a relatively complicated and expensive operating mechanism is required. Although air dielectric condensers have been designed for reciprocal movement, they have not been entirely satisfactory as means for guiding the plates so that the capacity thereof varies according to the same pattern during each movement have been very hard to construct. Variable inductances designed for rotary movement have also been attempted but the resulting units were relatively large and awkward and have not been found to be commercially feasible.

It is, therefore, an object of the present invention to provide an improved tuning assembly for a superheterodyne receiver which is simple and compact and which will efficiently tune both the antenna and oscillator circuits thereof.

It is a further object of this invention to provide a tuning assembly including a variable condenser for tuning an antenna circuit and a variable inductance for tuning an oscillator circuit, with the variable condenser and variable inductance being ganged for operation by a single control.

A still further object of this invention is to provide a tuning assembly for a superheterodyne receiver in which all of the elements required for tuning the antenna circuit and all of the tuning elements required for the oscillator circuit are combined in a single unit.

A feature of this invention is the provision of a tuning assembly including a condenser, the capacity of which is varied by moving a contact member along a dielectric plate, and an inductance, the value of which is varied by movement of a core within a coil.

A further feature of this invention is the provision of a tuning unit for a superheterodyne receiver including a variable condenser for tuning the antenna circuit and a variable inductance for tuning the oscillator circuit, both said condenser and inductance being varied by linear movement of one element thereof and being arranged so that a corresponding movement of each provides the desired relation between the antenna and oscillator circuits.

A still further feature of this invention is the provision of a plurality of variable and fixed condensers which are provided on a single dielectric plate by the provision of a plurality of coatings on one side of the plate and a plurality of movable conducting members and coatings on the other side of said plate.

Still another feature of this invention is the provision of a single tuner which includes a tuning condenser and a trimmer condenser for tuning a loop antenna and which includes a tuning inductance, a padding inductance, a main condenser, a trimmer condenser and a coupling condenser for the oscillator circuit, the tuning condenser and tuning inductance being ganged for operation by a single control and the various condensers being constructed as a single unit.

Further objects, features and advantages will be apparent from a consideration of the following description taken in connection with the accompanying drawings in which.

Figure 1:
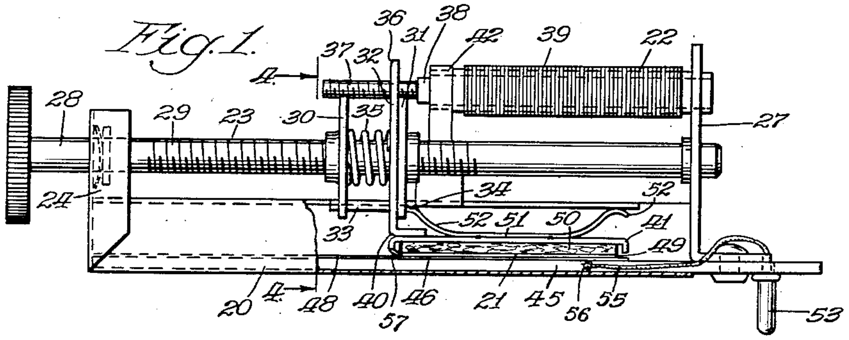
Fig. 1 illustrates a tuning unit in accordance with the invention.

In practicing my invention I provide a tuning assembly for a superheterodyne receiver including a mounting on which a variable condenser, a variable inductance and common operating means therefor are supported. The variable inductance includes an iron core movable in a coil and the variable condenser includes a dielectric plate having a conductive coating on one side thereof and a slideable contact member on the other side. The conducting surface of the condenser is so shaped that when the condenser is used to tune a loop antenna and the inductance is used to tune the oscillator circuit, common movement of the contact member and iron core will cause the antenna and oscillator circuits to have the desired frequency relation. The dielectric plate may be provided with additional conducting surfaces and contact members so that a plurality of additional condensers are formed thereby some of which are fixed and some of which may be adjusted. Additional inductances may also be provided on the mounting so that all of the circuit elements required in antenna and oscillator circuits of a superheterodyne receiver are provided by the tuning assembly.

Referring now more particularly to the drawings, in Figs. 1 to 4 there is illustrated a tuning assembly including a mounting 20 on which a condenser unit 21, inductance unit 22 and operating mechanism 23 are supported. The housing includes an integral front member 24, side portions 25 and 26 (Fig. 4) and a bracket 27 at the back thereof. Supported in bearings in the front member 24 and bracket 27 is a rotatable rod 28 having a threaded portion 29 on which slotted annular nuts 30 and 31 are positioned. A U-shaped carriage 32 bears against the nut 31 and has two struck-out portions 33 and 34 which fit in slots in the nuts 30 and 31, respectively. These portions prevent rotary movement of the nuts as the rod 28 is rotated but permit movement of the carriage with respect to the rod in a direction perpendicular to the rod. Spring 35 holds the carriage 32 against the nut 31 and holds the nuts tight against the threads 29 preventing backlash in the movement. The carriage 32 includes a portion 36 into which an actuating rod 37 is threaded, the actuated rod being connected to a core 38 which is movable in coil 39 of the variable inductance unit 22. The coil 39 is supported by the bracket 27 and by a support 42 secured to the side portion 26. The carriage 32 also includes a portion 40 adapted to move slider 41 of the condenser unit 21 as will be explained.

Referring now to the details of the variable condenser unit, the condenser includes an insulating plate 45 which is secured directly to the housing 20. The plate 45 may be made of Bakelite or similar insulating material. Supported on this plate is a thin dielectric plate 46 having a conducting coating 47 on a portion thereof. The dielectric plate may be formed of ceramic or other suitable material. A thin insulating plate 48 abuts the dielectric plate so that the top surface of the plates 46 and 48 form a completely flat surface. The slider 41 has secured thereto a contact member 49 which is supported from the slider by resilient material 50 which may be felt. The resilient material 50 serves to provide a relatively flexible conducting surface on the member 49 so that a firm contact is made between this surface and the ceramic plate 46 over the entire area of the surface which is in contact with the plate. The resilient material 50 may be secured to the slider 41 and to the contact member 49 in any suitable manner as by adhesive, to thereby hold the members in assembled relation. The slider 41 is biased toward the ceramic plate by a pair of springs 51 having end portions 52 which bear against in-turned lips on the sides 25 and 26 of the housing. A pair of pins 53 and 54 are secured in the Bakelite plate 45 for connecting the tuner to a socket provided in the radio chassis. Connection can be made to the conducting coating 47 by conductor 55 which enters a recess 56 in the insulating plate 45 and is connected to the bottom surface of the conducting coating. Connection to the contact member 49 can be made through the carriage and frame structure and through the bridging conductor 57.

Figure 2:
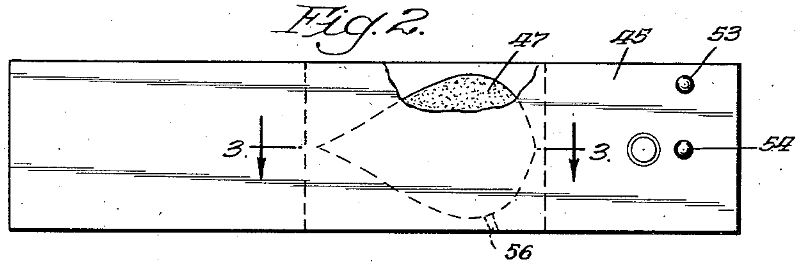
Figs. 2 and 3 are details of the condenser of the tuning unit of Fig. 1.
Figure 3:
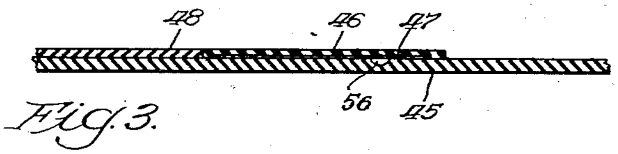
Figure 4:
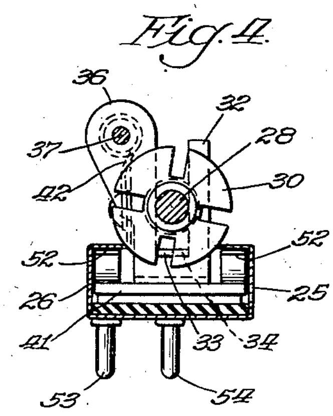
Fig. 4 is a cross-sectional view of the tuner along the lines 4—4 of Fig. 1.
Figure 5:
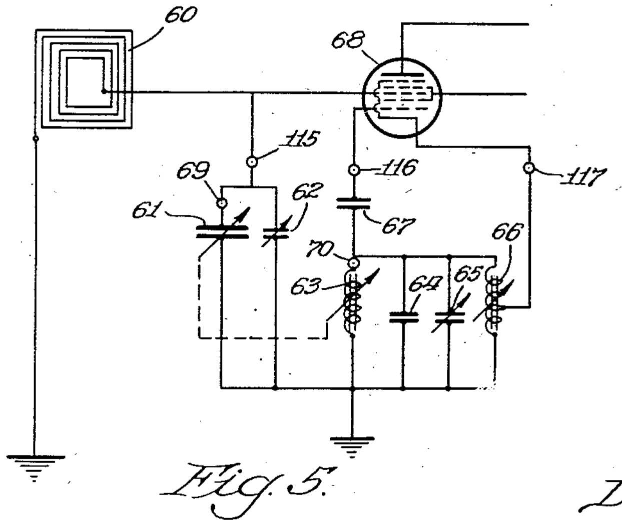
Fig. 5 is a circuit diagram illustrating a circuit in which the tuner in accordance with the invention may be used.

It is to be noted that the conducting coating 47 covers only a portion of the dielectric plate 46. It is well known that the capacity of a condenser depends upon the size of the conducting plates and it is readily apparent that the capacity of the condenser 21 for the various positions of the contact member 49 depends upon the shape of the conducting coating 47. The tuner disclosed in Figs. 1 to 4 is particularly adapted for tuning a superheterodyne receiver with the condenser 21 being used to tune a loop antenna and the inductance 22 used to tune the oscillator circuit. In such a circuit the frequency of the antenna circuit and the frequency of the oscillator circuit must differ by a constant frequency which is the intermediate frequency of the receiver. It is, therefore, possible to make the shape of the conducting coating such that by simultaneous movement of the contact member 49 of the condenser and the core 38 of the inductance, the frequencies of the antenna and oscillator circuits will have the desired relation through the frequency band which the receiver is adapted to receive. The coating 47 shown in Fig. 2 is shaped to provide tracking in a circuit such as shown in Fig. 5. In such a tuner, a given movement of the contact and core will not provide the same change in frequency of the circuits at different points in the travel thereof, but for any movement the change in frequency in the antenna and oscillator circuits will be the same so that the circuits will track. By properly shaping the conducting coating, any desired relation between travel of the contact member and the capacity of the condenser can be obtained.

In Fig. 5 there is illustrated a circuit in which the tuner of the invention might be utilized. The circuit shows a superheterodyne receiver having a loop antenna and a combined oscillator-modulator tube. It is particularly pointed out that the circuit of Fig. 5 is merely illustrative and the tuner is adaptable for use in variable other circuits, this circuit being chosen merely because of the simplicty thereof and the manner in which it illustrates the application of the invention. The loop antenna 60 is tuned by a variable condenser 61 and a trimmer condenser 62, the variable condenser being adapted to tune the circuit over the range of frequencies to be received and the trimmer condenser 62 being provided for adjustment to compensate for slight variance in the values of the various circuit elements. The oscillator is tuned by variable inductance 63 which is connected in parallel with a fixed condenser 64, a trimmer condenser 65 and a padding inductance 66. The padding inductance 66 includes a center tap for providing the proper coupling and preferably is variable through a small range of values for alignment of the receiver circuit. The tuned oscillator circuit is connected to the oscillator-modulator tube 68 by coupling condenser 67. For tuning the circuit shown by a single control, the variable condenser 61 and variable inductance 63 must be ganged and the values must be such that the antenna and oscillator circuis will have resonant frequencies which differ by a fixed amount (the intermediate frequency of the receiver) throughout the frequency range being received.

It is apparent that the tuner of Figs. 1 to 4 may be used in the circuit of Fig. 5 with the condenser 21 and inductance 22 being used at 61 and 63, respectively, in the circuit. It is noted from the circuit diagram that one side of each of these elements is grounded and this connection can be made to the elements 21 and 22 of Fig. 1 when the tuner is mounted on a radio chassis. The other connections to the condenser and inductance are made through pins 53 and 54 of the tuner, the points of connection being designated 69 and 70, respectively, in the circuit of Fig. 5.

Referring now to Figs. 6 to 10, there is illustrated a tuning assembly generally similar to the tuner of Figs. 1 to 4 but in which various additional circuit elements are included as a part of the tuning unit. There is shown a housing 80 which supports the components of the unit. An operating shaft 81 having a thread portion 82 is supported by the end members 79 and 80 of the housing 78. A carriage 83 is supported and driven by the operating shaft 81 and includes portions 84 for moving the slider of a variable condenser and a portion 85 for moving the core 86 of coil 87. The coil 87 is supported by the end member 80 of the housing as is a second coil 88 which also includes an iron core. The core of the coil 88 is not moved by the carriage 83 but may be adjusted by turning the threaded extension 89 which is held by clip 90 which supports the coil 88 on the end member 80.

The condenser structure is supported by insulating plate 91 which forms the bottom of the housing 78. Positioned on this plate is a dielectric plate 92 and insulating plate 93 which is of the same thickness as the dielectric plate to form a smooth top surface. As previously stated, a slider 94 is operated by the carriage 83, and includes an insulating plate 95 which is riveted to the portions 84 of the carriage by rivets 96 and a contact member 97 which is carried by the plate 95. Resilient material 98 is placed between the contact member and the insulating plate so that all of the surface of the contacting member 97 will be in contact with the dielectric plate 92 or the insulating plate 93.

Figure 6:
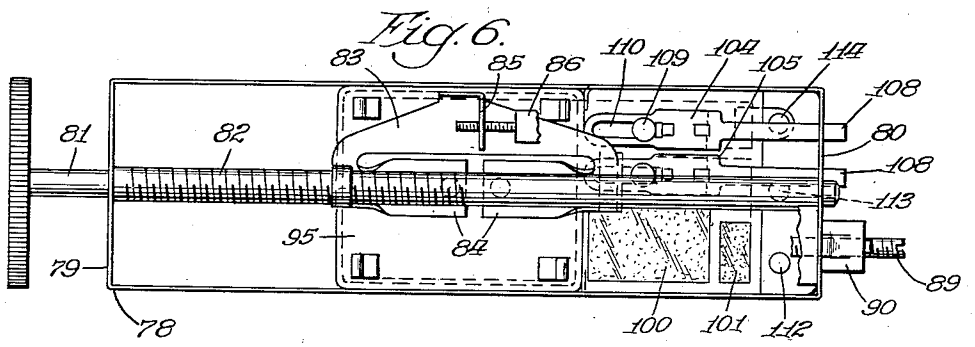
Fig. 6 is a top view of a modified tuner.
Figure 7:
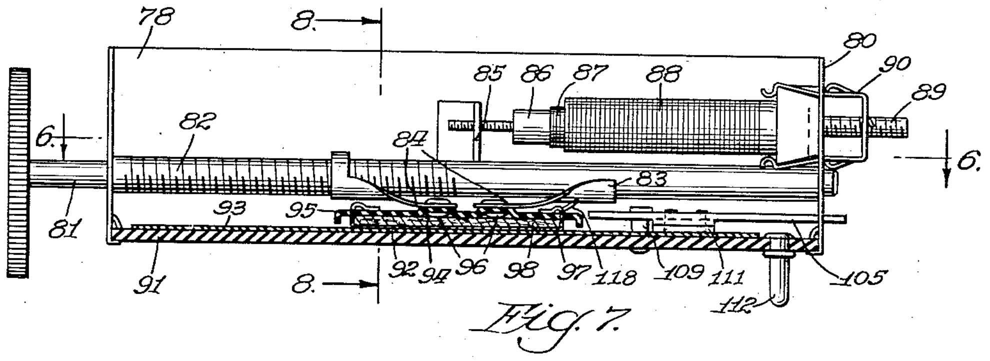
Fig. 7 is a side view of the tuner of Fig. 6.
Figure 9:
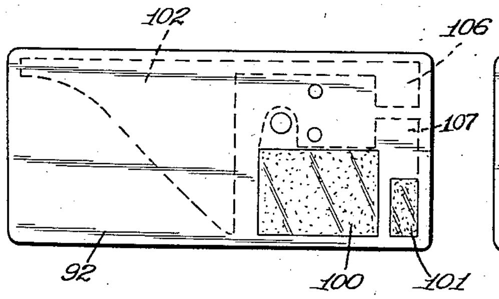
Figs. 9 and 10 are detailed views of the combined condenser unit of the tuner.
Figure 10:
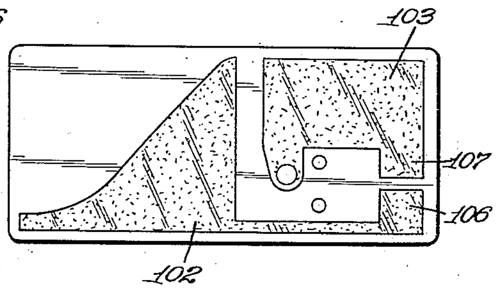
Figure 8:
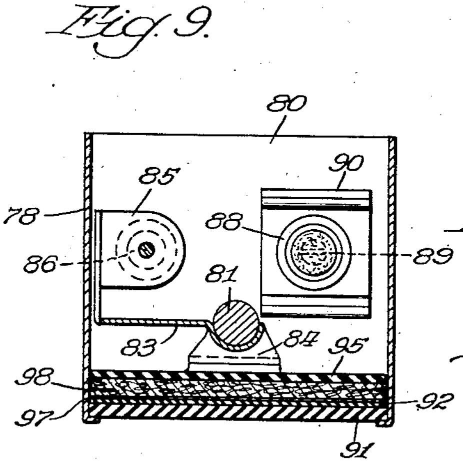
Fig. 8 is a cross-sectional view along the lines 8—8 of Fig. 7.

Referring now to the condenser structure, the dielectric plate 92 may be made of ceramic or other suitable material. Fig. 9 shows the plate having two coatings 100 and 101 on the top surface thereof and Fig. 10 shows that there are two conducting surfaces 102 and 103 on the bottom surface thereof. These conducting surfaces may be made by depositing silver or other suitable material on the ceramic plate. The large portion of the conducting surface 102 cooperates with the contact member 97 to form a variable condenser generally similar to the condenser 21 described in connection with Figs. 1 to 4. The portions 84 of the carriage 83 exert pressure through the insulating plate 95 to the contact member 97 so that a very close sliding contact is provided by the member on the ceramic plate. A flexible conductor 118 may be provided between the contact member 97 and the carriage 83 for making contact thereto through the frame of the tuner. As shown in Figs. 6 and 7, two other slideable contact members 104 and 105 are provided having contacting plates 111 for making contact with the ceramic plate 92. The contact member 104 cooperates with the portion 106 of the conducting surface 102 to form a condenser which is variable through a relatively small range and which, therefore, functions as a standard trimmer condenser. Contact member 105 cooperates with the projecting portion 107 of conducting surface 103 to form a similar trimmer condenser. It is to be noted that both contact members 104 and 105 include portions 108 extending outside the tuning unit for permitting adjustment thereof and are mounted on pins 109 which cooperate with slots 110 therein to permit movement of the contacting members 104 and 105. The conducting coatings 100 and 101 on the top surface of the ceramic plate cooperate with the conducting surface 103 on the bottom thereof to form two fixed condensers. Connection can be made to the various coatings in the same manner as described with reference to Figs. 1–4. Three connecting pins 112, 113 and 114 are provided for making electrical contact from the tuner to the radio receiver chassis and may be plugged into a socket provided thereon.

Referring again to Fig. 5 it is seen that the tuner of Figs. 6 to 10 includes condensers and inductances which will provide all the circuit elements required for the antenna circuit and the oscillator circuit. The main condenser defined by contact member 97 and conducting surface 102 forms the tuning condenser 61 of Fig. 5 and the trimmer condenser comprising conducting surface 106 and contact member 104 forms the trimmer condenser 62. It is noted that these two condensers are connected in parallel in the circuit so that the common connection defined by the conducting surface 102 forms one terminal and the contact members 97 and 104 can be connected to form the second terminal. The coil 87 together with the core 86 movable therein forms the tuning inductance 63 and the inductance 88 forms the parallel padding inductance 66 of Fig. 5. It is obvious that the coil 88 or 66 in circuit of Fig. 5 can be tapped so that it can be used in the manner indicated at 66 in Fig. 5. The fixed condenser defined by conducting surfaces 100 and 103 may be used at 64 in Fig. 5 and the trimmer condenser formed by movable contact member 105 and conducting surface 107 will provide the trimmer condenser 65. The small condenser formed by conducting surfaces 101 and 103 may be used as the coupling condenser 67 of Fig. 5. As the condensers 64, 65 and 67 all have a common terminal in the circuit shown, it is apparent that the three condensers formed by conducting surface 103 may be used in this arrangement with the conducting surface 103 forming the common terminal. The various elements of the tuner can be grounded as the housing is supported on a receiver chassis by any suitable mounting and the three terminals required as indicated at 115, 116 and 117 in Fig. 5 may be provided by the three connecting pins 112, 113 and 114 of Fig. 6.

It is, therefore, seen that a tuner has been provided wherein a variable condenser and a variable inductance are ganged for simultaneous operation and are mounted so that a very small space is required therefor. The tuner may include in addition to the variable condenser and variable inductance a plurality of fixed and trimmer condensers and padding inductances as desired to, therefore, provide all elements required for tuning the antenna and oscillator circuit of a superheterodyne receiver. The unit is particularly applicable to small receivers wherein it is desired to build a loop antenna directly in the receiver cabinet as the tuning condenser is particularly adaptable to tuning such an inductive loop antenna. Also the variable inductance is particularly adaptable for tuning the oscillator circuit as it permits design of a circuit in which the oscillatory current is substantially constant throughout the frequency range.

Although the use of the tuner has been described in connection with a receiver having a loop antenna and a common oscillator-modulator tube, it is apparent that tuners can be provided in accordance with the invention for use in other circuits such as for receivers having a tuned radio frequency stage. Also, various changes and modifications can be made in the structure as described herein which fall within the intended scope of the invention as defined in the appended claims.

I claim:

1. In a radio receiver having an antenna circuit and an oscillator circuit, means for tuning said circuits through a band of frequencies so that the resonant frequency of said antenna circuit and the resonant frequency of said oscillator circuit differ by a fixed amount comprising, a variable condenser in said antenna circuit, a variable inductor in said oscillator circuit, said condenser including an elongated plate of ceramic material having a conducting coating on a portion of one side thereof and a conducting member longitudinally slidable along the other side thereof, said conducting coating having a small width at one end thereof which gradually increases toward the other end thereof, said inductor including a substantially uniformly wound coil and a ferromagnetic core movable therein, and means for simultaneously moving said conducting member and said core so that said conducting member moves from a position covering only said one end of said coating to a position covering substantially the entire coating and said core moves from a position in which it is inserted in only the end of said coil to a position in which it is inserted in substantially the entire length of said coil, with the capacity of said condenser and the inductance of said inductor increasing simultaneously to change the frequency of said antenna circuit and said oscillator circuit by a fixed amount.

2. In a radio receiver having an antenna circuit and an oscillator circuit, means for tuning said circuits through a band of frequencies so that the resonant frequency of said antenna circuit and the resonant frequency of said oscillator circuit have a predetermined relation with respect to each other, comprising a variable condenser in said antenna circuit and including an elongated dielectric plate having a conducting coating on a portion of one side thereof and a conducting member longitudinally slidable along the other side thereof, a variable inductor in said oscillator circuit including a substantially uniformly wound coil and a ferromagnetic core movable therein, and means for simultaneously moving said member and said core, said conducting coating having a small width at one end thereof which gradually increases toward the other end thereof, said conducting member moving from a position covering only said one end of said coating to a position covering substantially the entire coating as said core moves from a position in which it is inserted in only the end of said coil to a position in which it is inserted in substantially the entire length of said coil, with the simultaneous movement of said member and said core being effective to tune said circuits to frequencies having a predetermined relation to each other throughout a range of frequencies.

3. In a radio receiver including an antenna circuit including a loop antenna, and an oscillator circuit; tuning means for tuning said circuits so that the resonant frequency of said antenna circuit and the resonant frequency of said oscillator circuit have a predetermined relation throughout a range of frequencies, said tuning means including a mounting, an elongated ceramic plate secured to said mounting, first and second conducting coatings on one side of said plate, a first conducting member longitudinally movable along the other side of said plate and cooperating with said first conducting coating to form a variable condenser, a second conducting member longitudinally movable along said other side of said plate and cooperating with said first conducting coating to form a first trimmer condenser, a third conducting member longitudinally movable along said other side of said plate and cooperating with said second conducting coating to form a second trimmer condenser, a pair of conducting coatings insulated from each other and secured to said other side of said plate to form with said second conducting coating a pair of fixed condensers, a variable inductance secured to said mounting including a coil and a core movable therein longitudinally with respect to said ceramic plate, a second inductance secured to said mounting, said variable condenser and said first trimmer condenser being included in said antenna circuit and said second trimmer condenser, said fixed condensers and said inductances being included in said oscillator circuit, and common operating means for moving said first conducting member and said core for simultaneously tuning said antenna circuit and said oscillator circuit through said range of frequencies, said second and third conducting members being movable for adjusting said trimmer condenser for alignment of said antenna and oscillator circuits.

4. A multiple condenser assembly comprising an elongated dielectric plate, first and second conducting coatings on one side of said plate, a first conducting member longitudinally movable along the other side of said plate and cooperating with said first conducting coating to form a variable condenser, a second conducting member movably positioned on the other side of said plate and cooperating with said first conducting coating to form a first trimmer condenser, a third conducting member movably positioned on said other side of said plate and cooperating with said second conducting coating to form a second trimmer condenser, and a pair of conducting coatings insulated from each other and secured to said plate to form with said second conducting coating a pair of fixed condensers.

5. A condenser unit comprising a mounting, an insulating plate secured to said mounting, a dielectric plate supported on said insulating plate and having a conducting coating on one side thereof, a contact member on the other side of said dielectric plate, and means for supporting and moving said contact member including a rod supported for rotation on said mounting and having a threaded portion, and a carriage adapted to be moved with respect to said mounting and including a portion engaging said threaded portion of said rod, said carriage including a supporting plate to which said contact member is secured and springs engaging said supporting plate for causing said contact member to be held firmly against said dielectric plate.

6. A variable condenser unit comprising a mounting, a dielectric plate supported on said mounting and having a conducting coating on one side thereof, a contact member movably supported on the other side of said dielectric plate, and means for moving said contact member including a rod supported for rotation on said mounting and having a threaded portion and a carriage including means engaging said threaded portion of said rod for moving said carriage with respect to said mounting in response to rotation of said rod, said carriage including a supporting plate, spring means engaging said supporting plate and resilient means interposed between said supporting plate and said contact member, said supporting plate and said contact member having interlocking portions so that said contact member moves with said supporting plate, said spring means applying pressure through said supporting plate and said resilient means to said contact plate and said resilient means distributing said pressure so that all points on the surface of said contact member are in contact with said dielectric plate, whereby the capacity of said condenser does not vary due to change in spacing between said contact member and said dielectric plate but depends only on the position of said contact member on said dielectric plate.

7. A condenser unit comprising a mounting, an insulating plate secured to said mounting, a dielectric plate supported on said insulating plate and having a conducting coating on one side thereof, a contact member on the other side of said dielectric plate, and means for supporting and moving said contact member including a rod supported for rotation on said mounting and having a threaded portion, and a carriage adapted to be moved with respect to said mounting and including means engaging said threaded portion of said rod, said carriage including a supporting plate to which said contact member is secured and springs engaging said mounting for holding said contact member firmly against said dielectric plate, said thread engaging means including a pair of nuts on the threaded portion of said rod and a spring interposed between said nuts, said nuts being connected to said carriage in such manner that rotation of said nuts is prevented and movement of said nuts along said rod causes movement of said carriage, said spring acting to hold said nuts firmly against the threads of said rod so that rotation of said rod in either direction causes movement of said nuts along the rod and backlash is thereby eliminated.

8. A condenser unit comprising a mounting, a dielectric plate supported on said mounting and having a conducting coating on one side thereof, a contact member on the other side of said dielectric plate, and means for supporting and moving said contact member including a rod supported for rotation on said mounting and having a threaded portion, a carriage including a horizontal U-shaped portion having arms extending on either side of said rod and a horizontal supporting plate to which said contact member is secured, springs engaging said mounting and said supporting plate for holding said contact member firmly against said dielectric plate, and means engaging said rod and said carriage for transmitting rotation of said rod into linear movement of said carriage, said means including a pair of annular slotted nuts on said threaded portion of said rod positioned on either side of said U-shaped portion of said carriage and a spring interposed between one of said nuts and said portion and holding said portion against the other of said nuts, said carriage including projections engaging the slots in said nuts for limiting rotation thereof while permitting horizontal movement of said carriage with respect to said rod, said spring acting to hold said nuts firmly against the threads of said rod so that any rotation of said rod in either direction causes movement of said nuts along said rod.

9. A condenser unit including in combination, a mounting, an elongated dielectric plate supported on said mounting having a conducting coating on one side thereof, and a contact member held against said dielectric plate, and longitudinally movable with respect thereto, apparatus for moving said contact member with respect to said dielectric plate comprising a rod supported for rotation on said mounting and having a threaded portion, a carriage including a U-shaped portion having arms extending on either side of said rod and a supporting plate to which said contact member is secured, and means engaging said threaded portion of said rod and said carriage for transmitting rotation of said rod into linear movement of said carriage, said means including a pair of annular slotted nuts on said threaded portion on said rod positioned on either side of said U-shaped portion of said carriage and a spring interposed between one of said nuts and said portion and holding said portion against the other of said nuts, said carriage including projections engaging the slots in said nuts for limiting rotation thereof while permitting movement of said carriage with respect to said rod in a direction perpendicular to said rod, said spring acting to hold said nuts firmly against the threads of said rod so that any rotation of said rod in either direction causes movement of said nuts along the rod and backlash is thereby eliminated.

DONALD H. MITCHELL.

REFERENCES CITED

The following references are of record in the file of this patent:

UNITED STATES PATENTS

| Number | Name | Date |
|---|---|---|
| 2,042,571 | Wheeler | June 2, 1936 |
| 2,061,991 | Wheeler | Nov. 24, 1936 |
| 2,147,425 | Bock | Feb. 14, 1939 |
| 2,206,820 | Mydlil | July 2, 1940 |
| 2,259,003 | Reid | Oct. 14, 1941 |
| 2,324,178 | Sprague et al. | July 13, 1943 |
| 2,338,134 | Sands et al. | Jan. 4, 1944 |
| 2,370,722 | Ehlers et al. | Mar. 6, 1945 |
| 2,425,454 | Bloch | Aug. 12, 1947 |
| 2,474,988 | Sargrove | July 5, 1949 |